(12) United States Patent
Huber et al.

(10) Patent No.: US 10,120,647 B2
(45) Date of Patent: Nov. 6, 2018

(54) APPARATUSES AND METHODS FOR TIMING DOMAIN CROSSING

(71) Applicant: Micron Technology, Inc., Boise, ID (US)

(72) Inventors: Brian Huber, Allen, TX (US); Gary Howe, Plano, TX (US)

(*) Notice: Subject to any disclaimer, the term of this patent is extended or adjusted under 35 U.S.C. 154(b) by 0 days.

(21) Appl. No.: 15/690,085

(22) Filed: Aug. 29, 2017

(65) Prior Publication Data

US 2017/0357482 A1   Dec. 14, 2017

Related U.S. Application Data

(63) Continuation of application No. 14/573,215, filed on Dec. 17, 2014, now Pat. No. 9,778,903.

(60) Provisional application No. 61/991,997, filed on May 12, 2014.

(51) Int. Cl.
*G06F 5/06*   (2006.01)
*H03K 5/26*   (2006.01)

(52) U.S. Cl.
CPC ............ *G06F 5/06* (2013.01); *H03K 5/26* (2013.01)

(58) Field of Classification Search
CPC ........................................... G06F 5/06
See application file for complete search history.

(56) References Cited

U.S. PATENT DOCUMENTS

| | | | | |
|---|---|---|---|---|
| 5,418,825 A | * | 5/1995 | Cantrell | G06F 1/14 327/113 |
| 5,857,005 A | * | 1/1999 | Buckenmaier | G06F 5/06 326/93 |
| 5,923,193 A | | 7/1999 | Bloch et al. | |
| 7,084,680 B2 | | 8/2006 | Lee et al. | |
| 7,260,734 B2 | | 8/2007 | Labate et al. | |
| 8,212,594 B2 | | 7/2012 | Singhal et al. | |
| 2015/0326213 A1 | | 11/2015 | Huber et al. | |

* cited by examiner

*Primary Examiner* — Patrick O'Neill

(57) ABSTRACT

Apparatuses and methods for a timing domain transfer circuit are disclosed. Disclosed embodiments may be configured to receive an event from one timing domain, output the event to another timing domain, and further configured to mark the event as transferred. An example method includes receiving an Event in based in a first timing domain at a first latch and receiving an intermediate event from the first latch by a second latch. The event is transferred to a second timing domain by the second latch and the first latch is reset based on feedback.

14 Claims, 6 Drawing Sheets

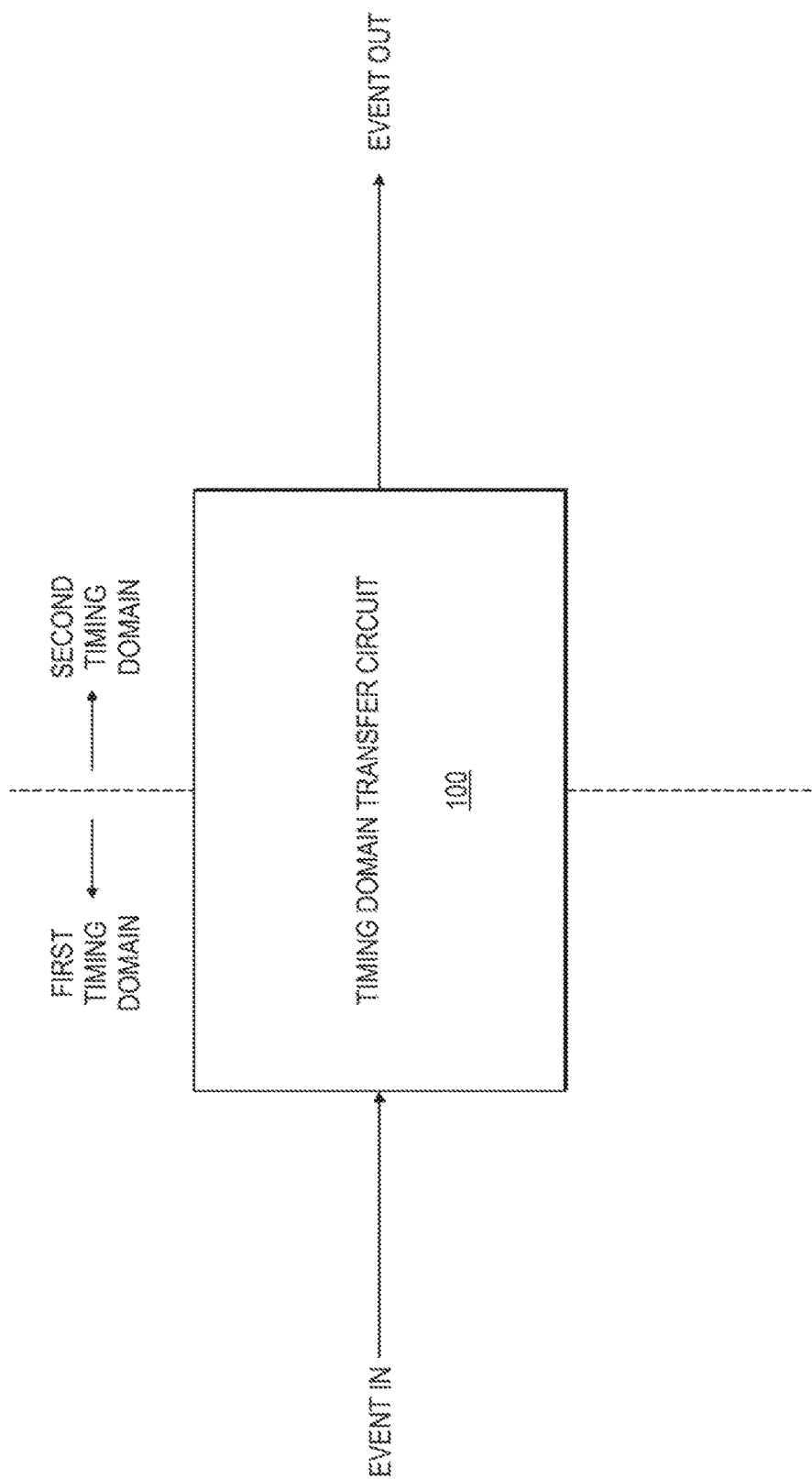

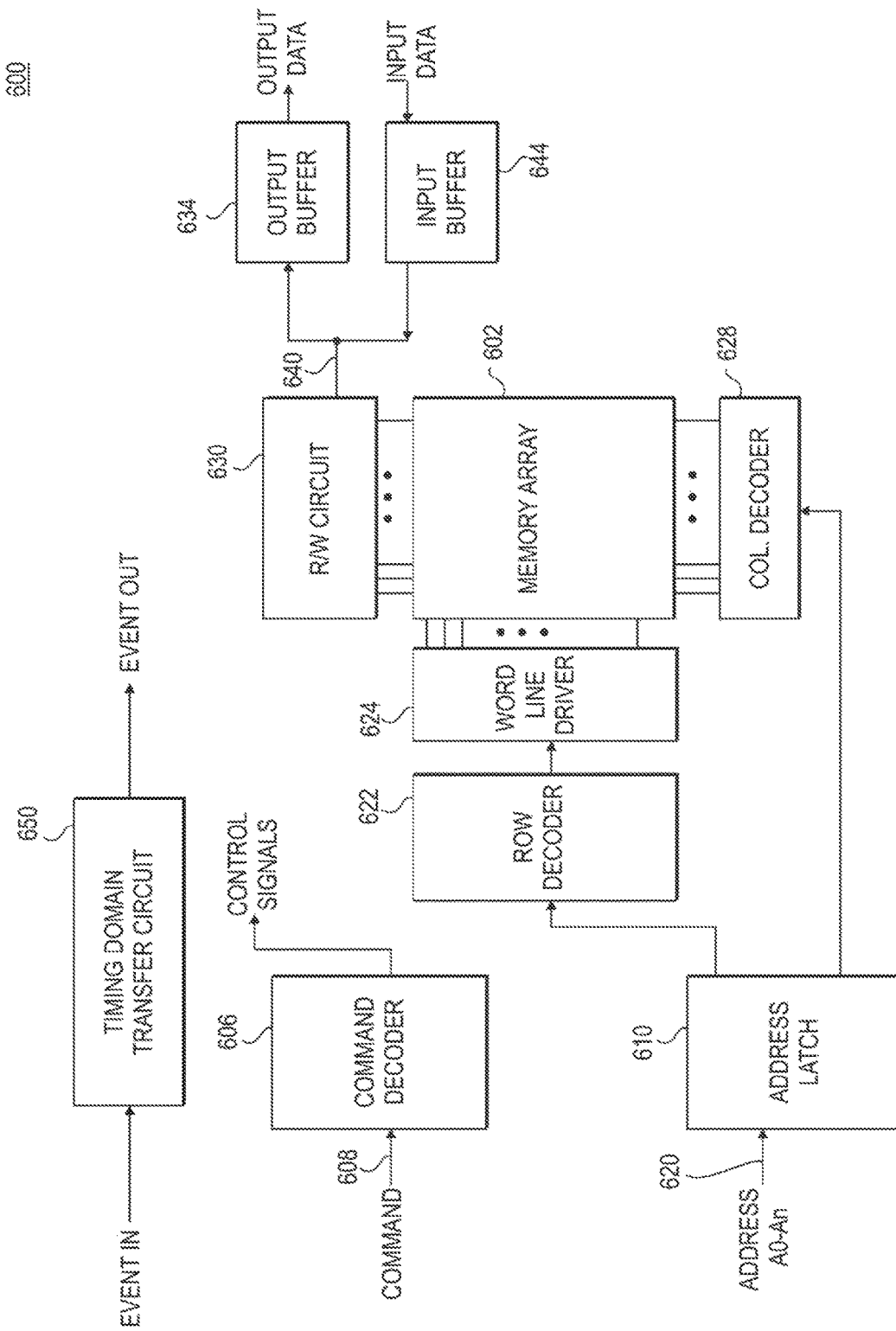

APPARATUSES AND METHODS FOR TIMING DOMAIN CROSSING

CROSS REFERENCE TO RELATED APPLICATION(S)

This application is a continuation of U.S. patent application Ser. No. 14/573,215, filed Dec. 17, 2014, issued as U.S. Pat. No. 9,778,903 on Oct. 3, 2017, which claims benefit under 35 U.S.C. 119(e) to U.S. Provisional Patent Application Ser. No. 61/991,997, entitled "APPARATUSES AND METHODS FOR TIMING DOMAIN CROSSING", filed May 12, 2014. The aforementioned applications and patent are incorporated herein by reference, in their entirety, for any purpose.

BACKGROUND

Modern electronics, e.g., smart phones, laptop computers, desktop computers, etc., conventionally operate based on specified timing so that the movement of data and commands in and out of the devices and within the devices operate in a controlled and predictable fashion. The timing in which these systems operate is typically based on a system clock operating at a specific frequency that is provided to all or most of the components of the system. The various interconnected components may then use the clock at the received frequency or at various derivatives of that frequency.

The various components of a system will receive commands and data signals based on the system clock. Some of the components may operate internally at a derivative rate based on the system clock and as such may convert the command/data signals into other timing domains. As part of this conversion process, the signals may be transferred from the system timing domain to the internal timing domain of the component. Additionally, some of the components may have various internal timing domains that the signals traverse and which would also require transfer of signals between the internal timing domains.

During the transfer of signals between timing domains, signals may be "lost" in the process, e.g., the signal may not make the transfer from one timing domain to a next. A lost signal may be one that is lost while in transfer between the timing domains due to inadequacies within the transfer process. For example, a signal presented to the receiving domain when that receiving domain is in the midst of transitioning to a next state (e.g., a high logic level) where the presented signal was not received before or after this next state boundary (e.g., before or after the transition) resulting in the "loss" of the presented signal. Once a signal is lost in the transfer process, all of the subsequent signals until a system reset may be out of place compared with an overall expected sequence. For example, if a command is lost during transfer, the data associated with that command may become associated with the next command, and so on down the sequence. An additional mechanism for upsetting the expected sequence of signals being transferred between two timing domains may include transferring a signal more than once. As with a lost signal, the same signal transferred multiple times may cause the processing of a sequence of events to fail to align with the expected sequence of events and may potentially result in lost information as well.

BRIEF DESCRIPTION OF THE DRAWINGS

FIG. 1 is an example block diagram of a timing domain transfer circuit in accordance with embodiments discussed herein.

FIG. 6 is a memory block diagram including an embodiment of a timing domain transfer circuit in accordance with embodiments discussed herein.

DETAILED DESCRIPTION OF PREFERRED EMBODIMENTS

Figure 2A:
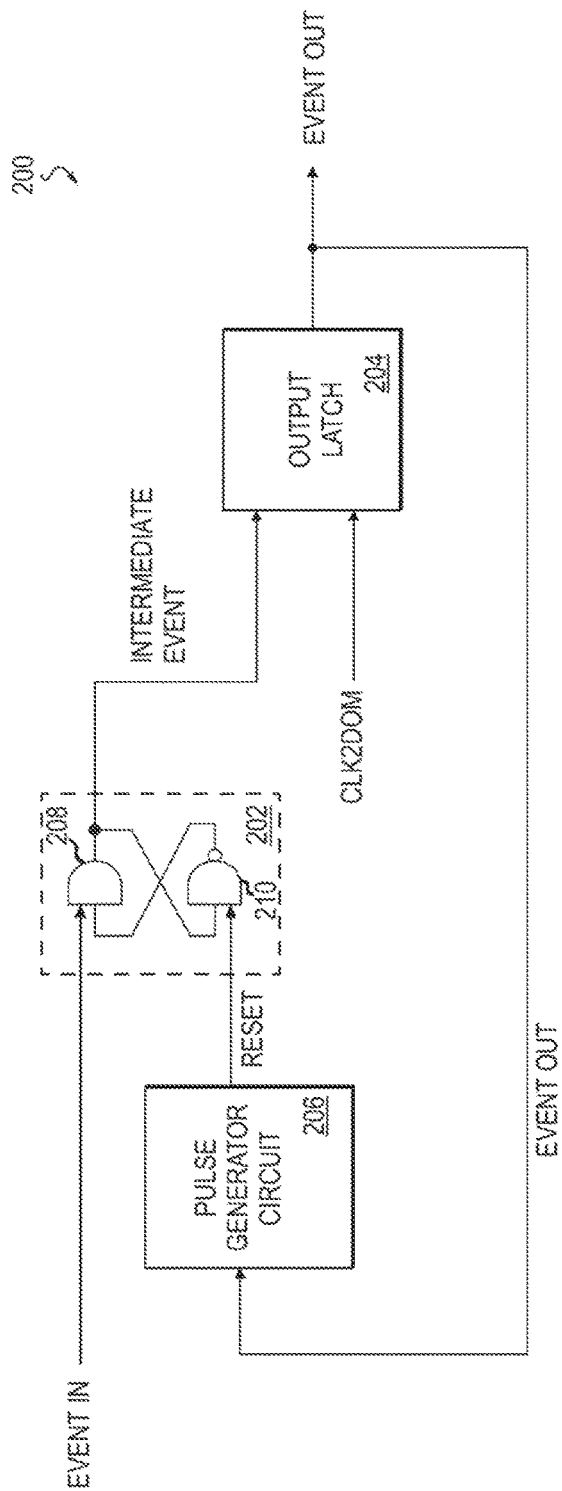
FIG. 2A is an illustrative embodiment of the timing domain transfer circuit of FIG. 1 in accordance with embodiments discussed herein.

One or more specific embodiments of the disclosed subject matter are described below. It is specifically intended that the disclosed subject matter not be limited to the embodiments and illustrations contained herein, but include modified forms of those embodiments including portions of the embodiments and combinations of elements of different embodiments as come within the scope of the following claims.

Embodiments of the disclosed subject matter are described with reference to the attached figures. Various structures, systems and devices are schematically depicted in the drawings for purposes of explanation only and so as to not obscure the embodiments of the disclosed subject matter with details that are well known to those skilled in the art. Nevertheless, the attached drawings are included to describe and explain illustrative examples of embodiments of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Nothing in this application is considered critical or essential to the disclosed subject matter unless explicitly indicated as being "critical" or "essential."

As noted above, many electronic systems and their various components operate on the basis of a system clock. Some of the various components, however, may internally operate on a different clock system, e.g., on a different or derivative clock rate. These different clock systems may be slower or faster than the system clock, e.g., twice the frequency of the system clock or half the frequency of the system clock. Additionally, the various components may operate across (e.g., include) multiple internal timing domains. The internal timing domains may differ due to the phase of their respective clock systems instead of a difference in clock rate. For example, circuits included in a memory may operate at the system clock rate and other circuits of the memory may operate at a derivative of the system clock rate, e.g., at half the system clock rate. A component or an area of a component, e.g., an operational area of a memory circuit, operating at a designated clock rate may be referred to as a "timing domain." As signals, commands and/or data propagate through the electronics and the components they may occasionally be transferred from one timing domain to another. The transfers may occasionally result in the loss of a signal. Signal losses may cause operational problems for downstream components and circuits that may be expecting those signals.

The signals may be lost in a variety of ways and the loss may be a partial result of the difference between the clock rate or clock phase of the two timing domains, as previously discussed. For example, a signal may be lost when the signal is presented to a receiving timing domain when that receiving timing domain is in the midst of transitioning to a next state where the signal was not transferred before or after this state boundary, which may result in the loss of the signal. Additionally, as noted above, a signal may be transferred more than once, which may also upset the movement of signals with regards to an expected sequence of signals between timing domains. If, for example, a sequence of command signals and a corresponding sequence of data signals are being transferred from one timing domain to another and one of the command signals is lost or transferred more than once, regardless of how, the missing signal or extra transfers may cause misalignment between the command and data sequence in the receiving time domain. The misalignment may then continue until a system reset, for example. The events may be represented by, for example, signals, signal transitions, signal levels (e.g., logic levels), signal timing, as well as others.

Further, the differences between timing domains may be due to a phase difference between their respective clocks and not due to a frequency difference. As such, events would need to be transferred between the timing domains to account for the phase difference and ensure events are not lost in the process. The phase difference, however, may account for the loss of events when the phase difference is too great, e.g., around half a clock cycle off. This loss of events may be caused by the phase difference between the timing domains causing an event to get lost between the domains due to misalignment of a reset and a latch command associated with the transferring circuitry. Any potential to lose events due to the phase difference may also be compounded with the relative spacing of the incoming events, e.g., the number of clock cycles between events.

One solution to ensure that an event is not lost or transferred more than once may involve a timing domain transfer circuit configured to determine that an event has been received by a second timing domain from a first timing domain before effectively marking it as transferred, e.g., clearing the timing domain transfer circuit of the event. The timing domain transfer circuit may base the transfer marking on feedback. The feedback may, at least in part, be based on the event being provided to or received by the second timing domain. By basing the feedback on the output of the timing domain transfer circuit, the event may be marked as transferred.

Another solution to this problem may be to ensure that an event signal is both transmitted to and received by the second timing domain from the first timing domain before marking it as transferred. This solution may involve a timing domain transfer circuit configured to use feedback based on the event signal being transmitted to and received by the second timing domain before marking the event as transferred or, for example, clearing the timing domain transfer circuit of the event. The event signal transferred and the event signal received may be the same event signal but taken from different points in the transfer process. Further, different sections or components of the timing domain transfer circuit may operate on a different clock based on either the first or second timing domains. For example, an input side of the timing domain transfer circuit may operate based on a clock of a first timing domain (e.g., the transferring timing domain) and an output side of the timing domain transfer circuit may operate on a clock of a second timing domain (e.g., the receiving timing domain). The feedback signals, however, may not be dependent upon the clock of either of the timing domains.

FIG. 1 is an example block diagram of a timing domain transfer circuit 100 in accordance with embodiments discussed herein. The timing domain transfer circuit 100 is depicted to straddle a boundary between two timing domains. This depiction is for illustrative purposes only and the timing domain transfer circuit 100 may operate in either one of or both of the timing domains. For example, the portion of the timing domain transfer circuit 100 shown in the first timing domain may operate on the first timing domain's clock. Similarly, the portion of the timing domain transfer circuit shown in the second timing domain may operate based on the second timing domain's clock. Alternatively, the portion of the timing domain transfer circuit 100 operating in the first timing domain may operate based only on the Event In signals and a feedback signal, which may be divorced from the clock of either timing domain. The timing domain transfer circuit 100 may receive events from a first timing domain and transfer the events to the second timing domain. As previously discussed, an event may be represented by signals, signal transitions, signal levels (e.g., logic levels), and signal timing, for example. The events may be received in any sequence with any number of clock cycles (based on either the first or second timing domains) between them, e.g., events may be spaced at every clock cycle, every other clock cycle, or every third clock cycle. The timing domain transfer circuit 100 may be configured to not mark an event as transferred until confirmation of the successful transfer of a current event to the second timing domain. The confirmation of the transfer to the second timing domain may be determined by the timing domain transfer circuit 100 based on one or more feedback signals. Marking the event as transferred responsive to the one or more feedback signals may, for example, clear the timing domain transfer circuit of the event. Clearing the timing domain transfer circuit of the event may have the added benefit of preventing the transfer of one or more instances of the event from being transferred to the second timing domain.

Occasionally, an event received for transfer by the timing domain transfer circuit 100 may arrive during a transition phase of a controlling clock, e.g., during a falling edge of the second timing domain's clock, which may not satisfy a set up time of the timing domain transfer circuit 100. In such an example, the event may miss a present clock edge but still may be transferred by the next falling edge of the controlling clock for a falling edge triggered flip flop or the next rising edge of the controlling clock for a rising edge triggered flip flop, for example. Thus, the event may not be lost and may be transferred a clock cycle later.

FIG. 2A is an example timing domain transfer circuit 200 in accordance with embodiments discussed herein. The timing domain transfer circuit 200 may comprise an input latch 202, an output latch 204, and a pulse generator circuit 206. The timing domain circuit 200 may be configured to receive events from the first timing domain and transfer the event to the second timing domain as illustrated in FIG. 1. Further, the timing domain transfer circuit 200 may be configured to not mark an event as transferred until an event currently in the transfer process has been confirmed to be transferred to, e.g., received by, the second timing domain.

The input latch 202 may receive the event from the first timing domain at a first input and may receive a reset signal at a second input. Upon being set by an Event In received at the first input, the input latch 202 may provide an Intermediate Event to an input of the output latch 204. The input latch 202 may be, for example, an R/S latch, which may include the two cross-connected NAND gates 208 and 210. An input to the NAND gate 208 may receive the Event In and an output of the NAND gate 208 may provide the Intermediate Event to the output latch 204. Further, an input of the NAND gate 210 may receive the RESET signal from the pulse generator circuit 206.

The output latch 204 may receive the Intermediate Event from the input latch 202 at a first input. The output latch 204 may also be clock controlled and may operate based on a clock of the second timing domain, shown in the example of FIG. 2 as CLK2DOM. Thus, the output latch 204 may provide an Event Out based on the CLK2DOM clock and the Intermediate Event. Event Out may then be sent to the second timing domain, and further provided to an input of the pulse generator circuit 206 as feedback. The output latch 204, for example, may be an edge sensitive master/slave D flip-flop.

The pulse generator circuit 206 may be configured to provide the reset signal to the input latch 202 based on the Event Out being provided to the second timing domain. Further, the pulse generator circuit may be configured to delay the event signal. The reset signal may then be generated from the combination of the event signal and the delayed event signal. The delay of Event Out may be configured to change the reset pulse width used to reset the input latch 202 to ensure the event has been transferred to the second timing domain without being so wide that the Event In is transferred more than once.

Figure 2B:
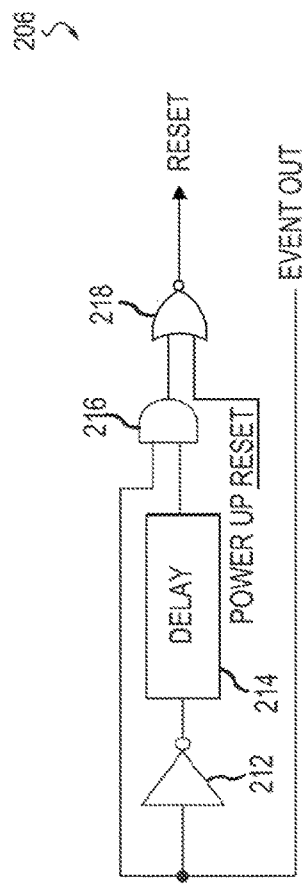
FIG. 2B is an example pulse generator circuit in accordance with embodiments discussed herein.

FIG. 2B is an example pulse generator circuit 206 in accordance with embodiments discussed herein. The pulse generator circuit 206, for example, may include an inverter 212, a delay 214, an AND gate 216 and a NOR gate 218. The example pulse generator circuit 206 may receive the Event Out as an input, which may also be one input to the AND gate 216. The Event Out may be delayed by the combination of the inverter 212 and the delay 214 and the delayed Event Out provided as another input to the AND gate 216. An output of the AND gate 216 may be provided to an input of the NOR gate 218. An output of the NOR gate 218 may provide the RESET pulse to the input latch 202. The OR gate 218 may receive a Power Up Reset at another input, which may be provided by a system reset signal to the timing domain transfer circuit 200.

The amount of delay added by the delay 214 may be selected so that the width of the RESET pulse is long enough to completely reset the input latch 202, but should not be too long. A delay that is too long may keep the input latch 202 in a reset state for an amount of time that may cause a subsequent event to be missed. As such, selecting a delay that provides some margin to the RESET pulse and further basing the RESET pulse on the Event Out may alleviate or eliminate this problem. Further, basing the RESET pulse on the Event Out and not on the clock directly of either timing domain may ensure that the input latch and in turn the Intermediate Event are not reset until the second timing domain has received the Event Out.

Figure 3A:
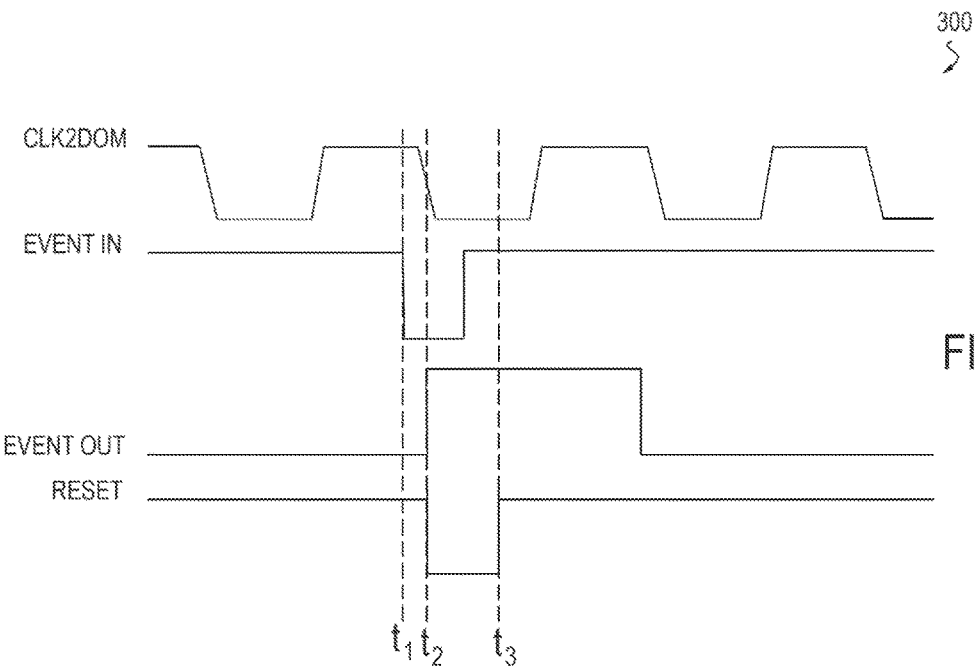
FIGS. 3A and 3B are illustrative timing diagrams of the example implementation of the timing domain transfer circuit as shown in FIG. 2 in accordance with embodiments discussed herein.
Figure 3B:
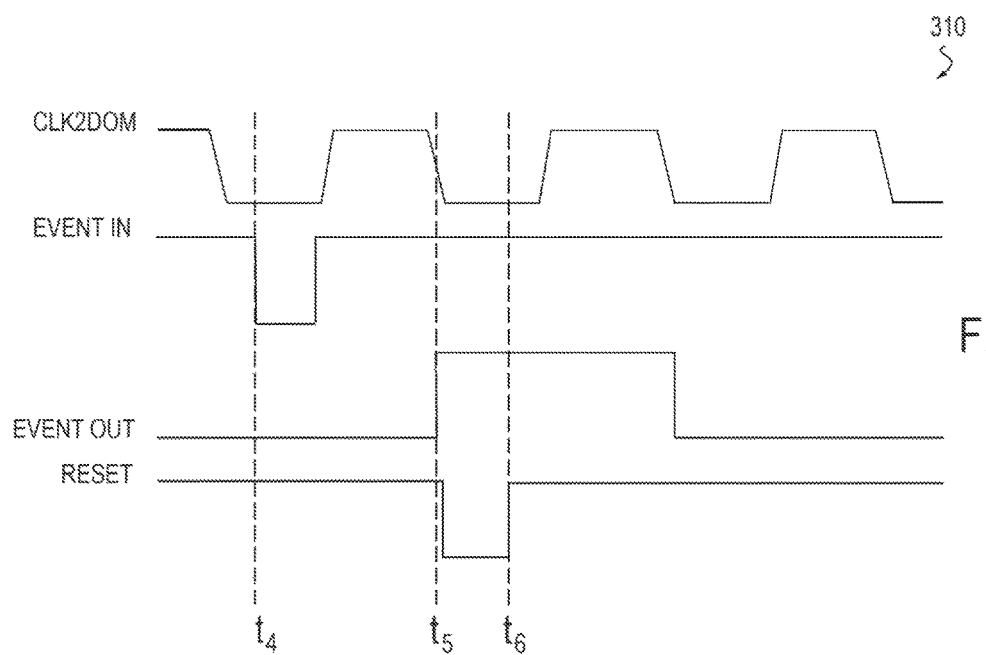

The operation of the timing domain transfer circuit 200 will now be further described in relation to the illustrative timing diagrams 300 of FIG. 3A and 310 of FIG. 3B. The timing diagram 300 illustrates various signals during operation of the timing domain transfer circuit 200 as an event signal is transferred from the first timing domain to the second timing domain.

The input latch 202 may latch Event In, represented by the transition from a high level to a low level as shown at time t. The input latch 202 provides the event signal to the output latch 204 as an Intermediate Event (not shown). The output latch 204 is clocked by the CIK2DOM signal to latch the Intermediate Event and provide Event Out into the second time domain at a falling edge of the CLK2DOM signal shown at time t2.

The Event Out is also provided to the pulse generator circuit 206, which provides a reset pulse to the input latch 202 beginning at time t2 responsive to Event Out. The RESET signal pulse width is shown by the time difference between times t2 and t3, and may be a function of the delay of the delay 214. The delay of the delay 214 may be selected such that the width of the RESET pulse is just long enough to ensure the input latch 202 is fully reset else it may not be reset and subsequent clock cycles may cause extra errant transfers by the output latch 204. An errant transfer may be additional transfers of a same Event In. A long delay for the delay 214 may result in missed Events In in addition to the extra errant transfers. The input latch 202 may be ready to accept a subsequent event after time t3, but the output latch 204 may not capture a subsequent Intermediate Event until a subsequent falling edge of the CLK2DOM clock signal. The event Event Out provided as a basis to reset the input latch 202 may ensure that the event is transferred to the second timing domain and not transferred more than once.

The timing diagram 310 of FIG. 3B also illustrates various signals during operation of the timing domain transfer circuit 200, but the Event In signal misses a falling edge of the CLK2DOM signal by transitioning low at time t4, which coincides with the CLK2DOM being low. However, even though the Event In missed the falling edge of CLK2DOM at time t4, the Intermediate Event (not shown) provided by the input latch 202 to the output latch 204 remains at a high logic level until a reset pulse is received by the input latch 202. Thus, the Event In is captured by the next falling edge of the CLK2DOM signal at time t5. Even though the Event In was not captured at a nearby prior clock edge, at time t4 for example, the Event In may still be transferred to the second timing domain since it was captured by the output latch 204 at time t5. Accordingly, the Event In was transferred to the second timing domain at a subsequent clock cycle and was not lost, even though it was later, with the Intermediate Event being held due to the reset of the input latch 202 being based on the Event Out, e.g., the RESET pulse may not be generated until the Event Out occurs.

Figure 4A:
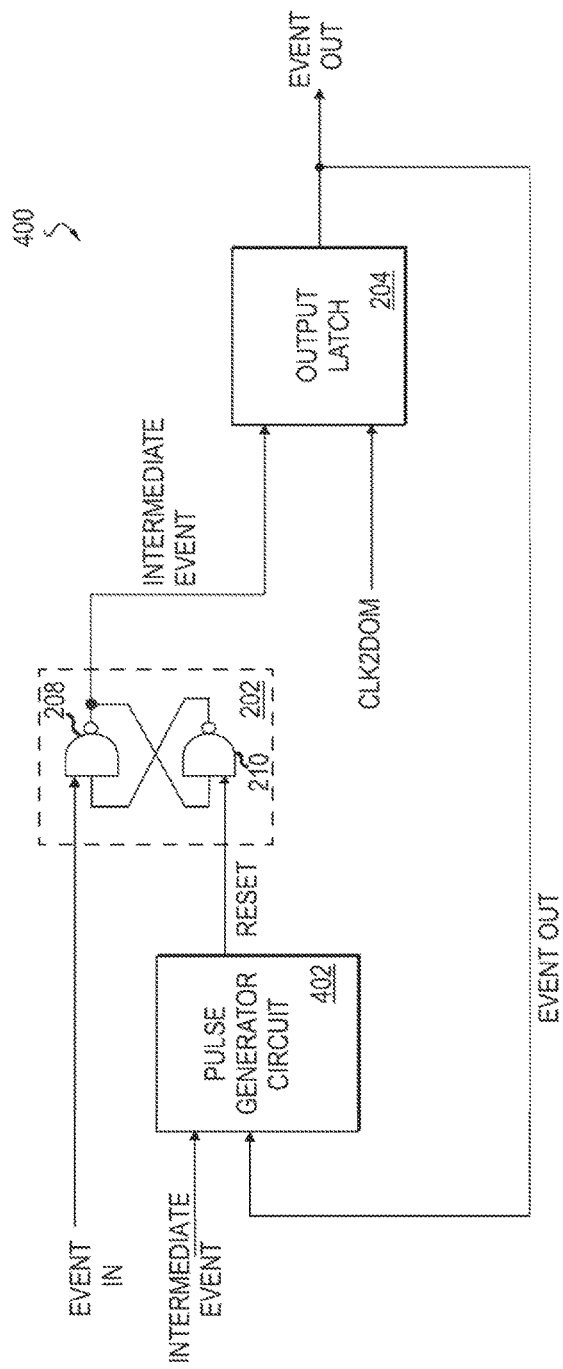
FIG. 4A is another illustrative embodiment of the timing domain transfer circuit of FIG. 1 in accordance with embodiments discussed herein.

FIG. 4A is an example timing domain transfer circuit 400 in accordance with embodiments discussed herein. The timing domain transfer circuit 400 may include the input latch 202, the output latch 204, and a pulse generator circuit 402. The input latch 202 and the output latch 204 may be configured similarly as discussed above with regards to FIG.

2. The input latch 202 may, for example, be a set/reset latch and the output latch 204 may, for example, be an edge sensitive master/slave D Flip-Flop. The timing domain transfer circuit 400 may be configured to transfer an event from the first timing domain to the second timing domain and further configured to reset the input latch based on both the Intermediate Event and the Output Event. Basing the reset of the input latch 202 on both the Intermediate Event and the Output Event may further ensure that events have been received by and output by the output latch 204 before the input latch is reset. This may eliminate the possibility of losing events or errant extra transfers of an event when they arrive at the timing domain transfer circuit 400 while the circuit is undergoing state transitions and, as such, may not be able to capture the event. Other event loss or extra errant event transfer mechanisms may also be averted by the timing domain transfer circuit 400.

The input latch 202 may receive the event from the first timing domain at a first input and may receive a reset signal at a second input. Upon being set by an event Event In received at an input, the input latch 202 may provide an event Intermediate Event. The Intermediate Event may be provided to an input of the output latch 204. The reset signal may be generated by the pulse generator circuit 401. The input latch 202 may be, for example, an R/S latch, which may include the two cross-connected NAND gates 208 and 210. An input to the NAND gate 208 may receive the event Event In and an output of the NAND gate 208 may provide the Intermediate Event to the output latch 204. Further, an input of the NAND gate 210 may receive the RESET from the pulse generator circuit 402.

The pulse generator 402 may have two inputs, one input coupled to the output latch 204 and the other input coupled to the input latch 202. The pulse generator 402 may be configured to delay the Intermediate Event but not delay the Event Out. Further, the pulse generator circuit 402 may be configured to generate the reset pulse based on the delayed Intermediate Event and the Output Event. In this configuration, the pulse generator circuit may reset the input latch 202, thereby avoiding extra transfers of the same event, only after the pulse generator circuit 402 has received the Output Event and the Intermediate Event. By delaying the Intermediate Event and not the Output Event, the timing domain transfer circuit 400 may ensure that the output latch 204 has both received the event and provided the event to the second timing domain, thereby ensuring the transfer of the event to the second timing domain.

Figure 4B:
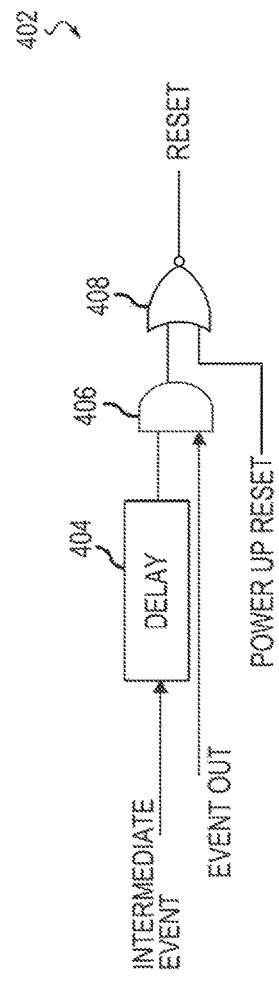
FIG. 4B is an example pulse generator circuit in accordance with embodiments discussed herein.

FIG. 4B is an example pulse generator circuit 402 in accordance with embodiments discussed herein. The pulse generator circuit 402 may be configured to provide a RESET pulse to the input latch 202 so that the timing domain transfer circuit 400 avoids errant extra transfers. The example pulse generator circuit 402 may include a delay 404, an AND gate 406, and a NOR gate 408. The delay 404 may receive the Intermediate Event and provide a delayed Intermediate Event to one input of the AND gate 406. A second input of the AND gate 406 may receive the Event Out and an output of the AND gate 406 may be provided to the OR gate 408. An output of the NOR gate 408 may then provide the RESET pulse to the input latch 202. The NOR gate 408 may receive a Power Up Reset at a second input which may signal when the timing domain transfer circuit 400 has been reset or an external system has been reset.

The amount of overlap of the Event Out and the delayed Intermediate Event signals at the inputs of the AND gate 406 may determine the width of the RESET pulse, which may be affected by the delay amount of the delay 404. The width of the Event In pulse may vary due to variations in the timing domain transfer circuit 400, e.g., process, voltage and temperature effects, but since the RESET pulse is common to the Event In pulse, e.g., partially based on, the width of the RESET pulse may track the width of the Event In pulse but may be longer based on the amount of delay added by the delay 404. Thus, if the Event In and the RESET pulse happen at different times, e.g., such that there is no overlap, then the delay 404 may be long enough to ensure that the RESET pulse resets the input latch 202. The resetting of the input latch 202 may then allow the timing domain transfer circuit 400 avoid extra errant transfers.

Figure 5A:
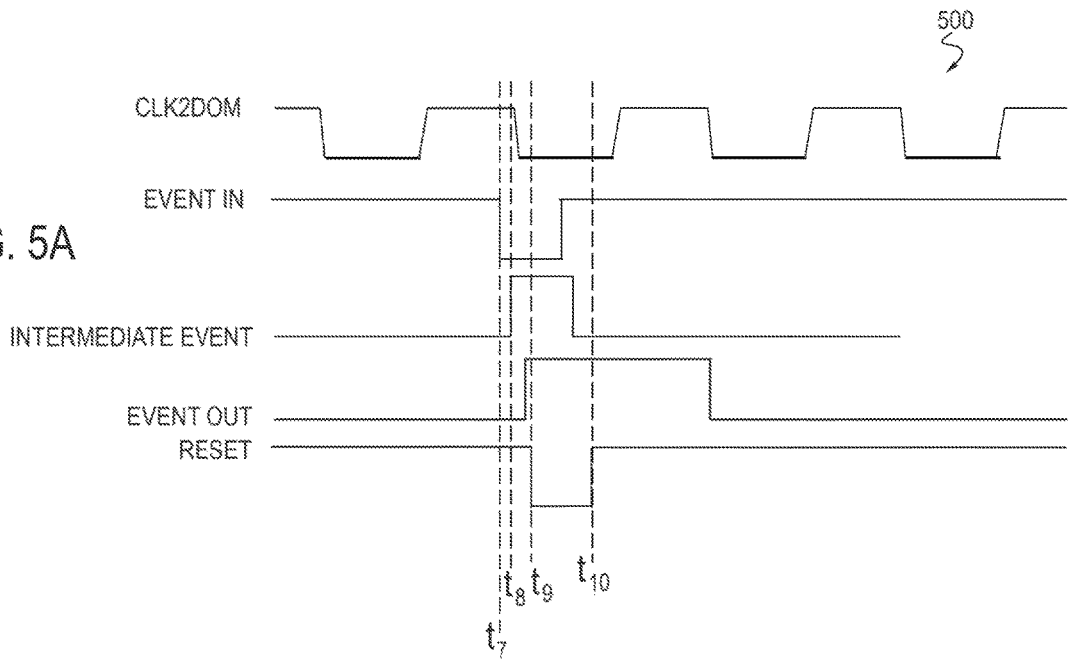
FIGS. 5A and 5B are illustrative timing diagrams of the example implementation of the timing domain transfer circuit as shown in FIG. 4 in accordance with embodiments discussed herein.
Figure 5B:
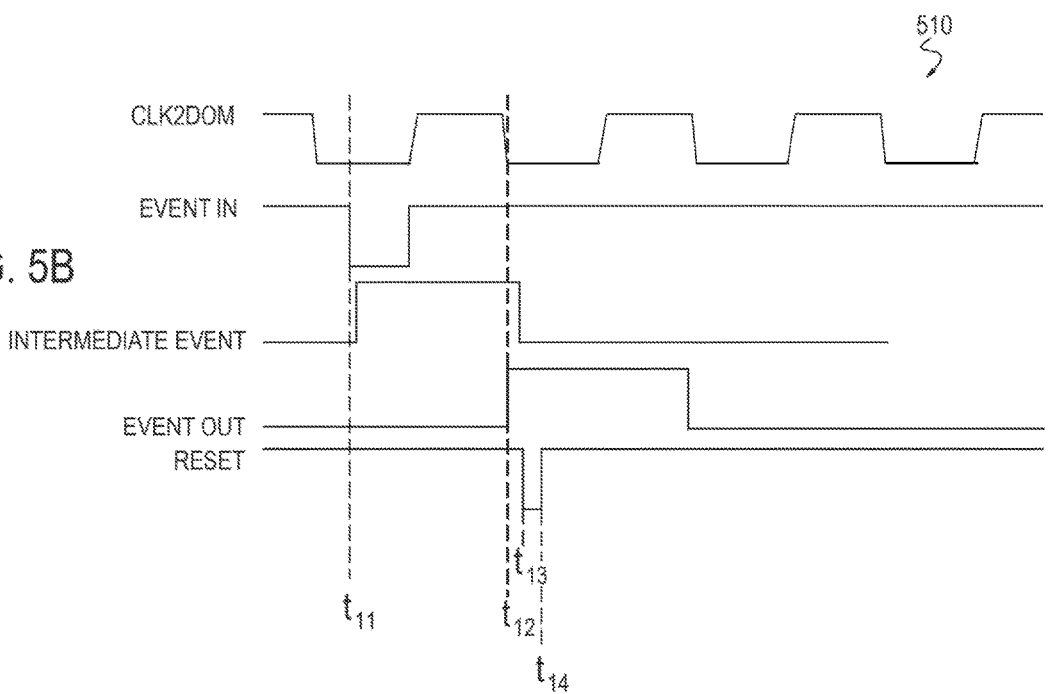

The operation of the timing domain transfer circuit 400 will now be further described in relation to the illustrative timing diagrams 500 of FIG. 5A and 510 of FIG. 5B. The timing diagram 500 illustrates various signals of the timing domain transfer circuit 400 as an event is transferred from the first timing domain to the second timing domain.

An Event In occurs at time t7 (e.g., is received by the input latch 202) that results in the Intermediate Event. The Intermediate Event may then set up in time to be captured by the output latch 204 at time t8. The Event Out may then be provided by the output latch 204 to the second timing domain. The Intermediate Event and the Event Out may also be provided to the pulse generator circuit 402 commensurate with their output by their respective circuits.

The pulse generator circuit 402 may delay the Intermediate Event but may not delay the Event Out. At time t9 the reset pulse may be generated since both the delayed Intermediate Event and the Event Out are both concurrently high at the inputs of the AND gate 406. The reset pulse may then be transmitted to the input latch 202 at time t9. After time t10, the input latch 202 may be ready to receive a subsequent event. Using both Intermediate Event and Event Out to initiate the RESET pulse, the timing domain transfer circuit 400 may ensure that an event is not marked as transferred until a current event in transfer is both transferred to and received by the second timing domain.

The timing diagram 510 also illustrates various signals during operation of the timing domain transfer circuit 400, but the Event In signal misses a nearby prior falling edge of the CLK2DOM signal by transitioning low at time t11, which coincides with the CLK2DOM being at a low state. Even though the Event In missed the nearby falling edge of the CLK2DOM clock signal, the input latch 202 provides an Intermediate Event to the output latch 204 for subsequent capture. Because the input latch 202 may not be reset until both the Intermediate Event and the Event Out signals are present at the pulse generator circuit 402, the Intermediate Event may remain at a high logic so that the output latch 204 captures the Intermediate Event (e.g., the Event In) at time t12. At time t12, the Event Out and the Intermediate Event may both be present at the inputs of the pulse generator circuit 402. The RESET pulse may then be provided to the input latch 202 by the pulse generator circuit 402 at time t13. The length of the RESET pulse (t13 to t14) may represent the amount of delay of the delay 404 and may be long enough to ensure the input latch 202 is reset so extra errant transfers do not occur.

FIG. 6 illustrates a memory 600 including a timing domain transfer circuit according to an embodiment as discussed herein. The memory 600 includes an array 602 of memory cells, which may be, for example, volatile memory cells (e.g., DRAM memory cells, SRAM memory cells), non-volatile memory cells (e.g., flash memory cells), or some other types of memory cells. The memory system 600 includes a command decoder 606 that receives memory commands through a command bus 608 and generates corresponding control signals within the memory system 600 to carry out various memory operations. The command decoder 606 responds to memory commands applied to the command bus 608 to perform various operations on the memory array 602. For example, the command decoder 606 is used to generate internal control signals to read data from and write data to the memory array 602. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630.

A timing domain transfer circuit 650 may include a signal path, the signal being either a command signal or a data signal, according to embodiments discussed herein. An Event In signal may be provided to the timing domain transfer circuit 650, which may be configured to transfer an event from one timing domain to another as an Event Out signal, and further ensure that the event has been both transmitted to and received by the second timing domain before marking the event as transferred. The timing domain transfer circuit 650 may be configured to mark an event as transferred or be placed in a state where a subsequent event may be accepted based on a feedback signal. The feedback signal may be based, at least in part, on the Output Event signal and may be further based on an intermediate event signal. By not marking an event as transferred until enabled by the feedback signal, the timing domain transfer circuit 650 may reduce or eliminate the loss or the extra errant transfers of events being transferred between the two timing domains.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

What is claimed is:

1. An apparatus comprising:
   an input circuit configured to latch an input signal to provide an intermediate signal;
   an output circuit configured to provide an output signal responsive to the intermediate signal and a clock signal; and
   a pulse generator circuit including a delay circuit and configured to provide a feedback pulse based, at least in part, on the output signal;
   wherein the input circuit is configured to reset latching the input signal responsive to the feedback pulse,
   wherein the pulse generator circuit is configured to provide the feedback pulse based only on the output signal, and
   wherein the pulse generator circuit is configured to produce one of rising and trailing edges of the feedback pulse responsive to one of rising and trailing edges of the output signal and produce the other of rising and trailing edges of the feedback pulse responsive to a delayed one of rising and trailing edges of the output signal.

2. The apparatus of claim 1, wherein the input signal is provided asynchronously to the clock signal and the output circuit is configured to provide the output signal in synchronism with the clock signal.

3. An apparatus comprising:
   an input circuit configured to latch an input signal to provide an intermediate signal;
   an output circuit configured to provide an output signal responsive to the intermediate signal and a clock signal; and
   a pulse generator circuit including a delay circuit and configured to provide a feedback pulse based, at least in part, on the output signal;
   wherein the input circuit is configured to reset latching the input signal responsive to the feedback pulse, and
   wherein the pulse generator circuit is configured to produce one of rising and trailing edges of the feedback pulse responsive to the intermediate signal and the other of rising and trailing edges of the feedback pulse responsive to the output signal.

4. An apparatus comprising:
   an input circuit configured to latch an input signal to provide an intermediate signal;
   an output circuit configured to provide an output signal responsive to the intermediate signal and a clock signal; and
   a pulse generator circuit including a delay circuit and configured to provide a feedback pulse based, at least in part, on the output signal;
   wherein the input circuit is configured to reset latching the input signal responsive to the feedback pulse, and
   wherein the pulse generator circuit is configured to provide the feedback pulse regardless of the output signal when the pulse generator circuit receives a power-up-reset signal.

5. An apparatus comprising:
   a signal input terminal;
   a signal output terminal;
   a clock input terminal;
   a RS latch circuit including a set node coupled to the signal input terminal, and further including a reset node and a first output node;
   an output latch circuit including a first input node coupled to the first output node and a clock node coupled to the clock input terminal, the output latch further including a second output node; and
   a pulse generator circuit including a delay circuit, and further including a second input node coupled to the second output node and a third output node coupled to the reset node,
   wherein the pulse generator circuit includes a third input node coupled to the first output node.

6. The apparatus of claim 5, wherein the pulse generator circuit includes an AND logic circuit, two inputs of the AND logic circuit are coupled to the second input node and the third input node, respectively, and an output of the AND logic circuit is coupled to the third output node.

7. The apparatus of claim 5, wherein the pulse generator circuit includes an AND logic circuit;
wherein an input of the delay circuit is coupled to the second input node and an output of the delay circuit is coupled to one of two inputs of the AND logic circuit; and
wherein another of two inputs of the AND logic circuit is coupled to the second input node and an output of the AND logic circuit is coupled to the third output node.

8. The apparatus of claim 5, wherein the signal input terminal is configured to receive an input signal activated during a first period of time and the signal output terminal is configured to be supplied with an output signal activated during a second period of time longer than the first period of time.

9. The apparatus of claim 5, wherein the clock input terminal is supplied with a clock signal and the output latch circuit is configured to provide a signal to the signal output terminal in synchronism with the clock signal.

10. An apparatus comprising:
an input circuit configured to latch an input signal to provide an intermediate signal;
an output circuit configured to provide an output signal responsive to the intermediate signal and a clock signal; and
a pulse generator circuit configured to provide a feedback pulse based only on the output signal and further configured to produce one of rising and trailing edges of the feedback pulse responsive to one of rising and trailing edges of the output signal and produce the other of rising and trailing edges of the feedback pulse responsive to a delayed one of rising and trailing edges of the output signal;
wherein the input signal is provided asynchronously to the dock signal and the output circuit is configured to provide the output signal in synchronism with the clock signal; and
wherein the input circuit is configured to reset latching the input signal responsive to the feedback pulse.

11. An apparatus comprising:
an input circuit configured to latch an input signal to provide an intermediate signal;
an output circuit configured to provide an output signal responsive to the intermediate signal and a clock signal; and
a pulse generator circuit configured to provide a feedback pulse based, at least in part, on the output signal, wherein the pulse generator circuit is configured to produce one of rising and trailing edges of the feedback pulse responsive to the intermediate signal and the other of rising and trailing edges of the feedback pulse responsive to the output signal;
wherein the input circuit is configured to reset latching the input signal responsive to the feedback pulse.

12. An apparatus comprising:
a signal input terminal;
a signal output terminal;
a clock input terminal;
a RS latch circuit including a set node coupled to the signal input terminal, and further including a reset node and a first output node;
an output latch circuit including a first input node coupled to the first output node and a clock node coupled to the clock input terminal, the output latch further including a second output node; and
a pulse generator circuit including a second input node coupled to the second output node and a third output node coupled to the reset node, and further including a third input node coupled to the first output node.

13. The apparatus of claim 12, wherein the pulse generator circuit includes an AND logic circuit, two inputs of the AND logic circuit are coupled to the second input node and the third input node, respectively, and an output of the AND logic circuit is coupled to the third output node.

14. An apparatus comprising:
a signal input terminal;
a signal output terminal;
a clock input terminal;
a RS latch circuit including a set node coupled to the signal input terminal, and further including a reset node and a first output node;
an output latch circuit including a first input node coupled to the first output node and a clock node coupled to the clock input terminal, the output latch further including a second output node; and
a pulse generator circuit including a second input node coupled to the second output node and a third output node coupled to the reset node, and further including an AND logic circuit and a delay circuit;
wherein an input of the delay circuit is coupled to the second input node and an output of the delay circuit is coupled to one of two inputs of the AND logic circuit; and
wherein another of two inputs of the AND logic circuit is coupled to the second input node and an output of the AND logic circuit is coupled to the third output node.

* * * * *